US012628272B2

(12) United States Patent
Coffy et al.

(10) Patent No.: US 12,628,272 B2
(45) Date of Patent: May 12, 2026

(54) INTEGRATED CIRCUIT OPTICAL PACKAGE COMPRISING A FLEXIBLE ELECTRICAL CONNECTION ELEMENT

(71) Applicant: STMicroelectronics (Grenoble 2) SAS, Grenoble (FR)

(72) Inventors: Romain Coffy, Voiron (FR); Younes Boutaleb, Grenbole (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 456 days.

(21) Appl. No.: 18/205,655

(22) Filed: Jun. 5, 2023

(65) Prior Publication Data

US 2023/0403791 A1     Dec. 14, 2023

(30) Foreign Application Priority Data

Jun. 8, 2022     (FR) ...................................... 2205475

(51) Int. Cl.
H10F 55/20 (2025.01)
H05K 1/02 (2006.01)
(Continued)

(52) U.S. Cl.
CPC ........... H05K 1/036 (2013.01); H05K 1/0209 (2013.01); H05K 1/11 (2013.01); H05K 3/4697 (2013.01);
(Continued)

(58) Field of Classification Search
CPC ........ H05K 1/036; H05K 1/0209; H05K 1/11; H05K 3/4697; H05K 3/0061;
(Continued)

(56) References Cited

U.S. PATENT DOCUMENTS

| | | | |
|---|---|---|---|
| 2009/0028497 | A1 | 1/2009 | Kodama et al. |
| 2016/0025855 | A1 | 1/2016 | Camarri et al. |

(Continued)

FOREIGN PATENT DOCUMENTS

| | | |
|---|---|---|
| CN | 101432759 A | 5/2009 |
| CN | 212257992 U | 12/2020 |

(Continued)

OTHER PUBLICATIONS

CN First Office Action and Search Report for counterpart CN Appl. No. 202310668501.6, report dated Apr. 3, 2026, 8 pgs.

*Primary Examiner* — William B Partridge
*Assistant Examiner* — Chevy J Boegel
(74) *Attorney, Agent, or Firm* — Crowe & Dunlevy LLC

(57) ABSTRACT

An integrated-circuit package includes a flexible electrical-connection element sandwiched between a first face of a first multilayer support substrate and a second face of a second multilayer support substrate. The flexible electrical-connection element laterally projects with respect to, and is in electrical contact with at least one of, the multilayer support substrates. The flexible electrical-connection element and the first multilayer support substrate include, at a first region, respectively two first mutually facing orifices defining together a first cavity. The first cavity is at least partially closed off by a first part of the second face of the second multilayer support substrate. A first component is located in the first cavity, attached at the first part of the second face of the second multilayer support substrate and in electrical contact with the flexible electrical-connection element through the second multilayer support substrate.

23 Claims, 4 Drawing Sheets

(51) Int. Cl.

| | | |
|---|---|---|
| *H05K 1/03* | (2006.01) | |
| *H05K 1/11* | (2006.01) | |
| *H05K 3/46* | (2006.01) | |
| *H10F 55/00* | (2025.01) | |

(52) U.S. Cl.
CPC ............ *H10F 55/00* (2025.01); *H10F 55/20* (2025.01); *H05K 2201/10121* (2013.01); *H05K 2201/10689* (2013.01)

(58) Field of Classification Search
CPC .............. H05K 3/4635; H05K 3/4691; H05K 2201/10121; H05K 2201/10689; H05K 2201/0108; H05K 2201/058; H05K 1/0203; H05K 1/115; H05K 1/0274; H05K 1/183; H05K 2203/049; H10F 55/20

See application file for complete search history.

(56) References Cited

U.S. PATENT DOCUMENTS

| | | | |
|---|---|---|---|
| 2016/0270227 A1 | 9/2016 | Wu et al. | |
| 2018/0084647 A1* | 3/2018 | Nalla .................. | H05K 3/4697 |
| 2019/0157469 A1* | 5/2019 | Saxod ............... | H10H 20/8506 |
| 2019/0355864 A1* | 11/2019 | Coullomb .............. | H10F 77/50 |
| 2021/0104642 A1* | 4/2021 | Choi .................. | H10H 20/8506 |

FOREIGN PATENT DOCUMENTS

| | | |
|---|---|---|
| CN | 221239605 U | 6/2024 |
| EP | 2000833 A1 | 12/2008 |
| WO | 2021203874 A1 | 10/2021 |

* cited by examiner

INTEGRATED CIRCUIT OPTICAL PACKAGE COMPRISING A FLEXIBLE ELECTRICAL CONNECTION ELEMENT

PRIORITY CLAIM

This application claims the priority benefit of French Application for Patent No. 2205475, filed on Jun. 8, 2022, the content of which is hereby incorporated by reference in its entirety to the maximum extent allowable by law.

TECHNICAL FIELD

Embodiments and implementations relate to the field of microelectronics, in particular the field of packaging of integrated circuits and more particularly integrated-circuit packages, for example integrated-circuit optical packages, intended to be offset with respect to a printed circuit card and electrically connected thereto by a flexible connector, also known to a person skilled in the art as a "flex".

BACKGROUND

Such a flexible connection element, or connector, is well known to a person skilled in the art and generally comprises a web of metal tracks on one or more levels, mutually electrically insulated by an insulating resin and intended to route electrical signals.

A person skilled in the art can optionally refer to an article on such flexible connectors, entitled "Flexible electronics" available on the internet.

The structure of such a connector (in particular its very low thickness) confers great flexibility thereon, thus making it possible to twist it greatly, optionally with angles that may range up to 180°.

It moreover proves necessary, for certain types of package, such as optical packages (i.e., those comprising at least one optical device), to provide support substrates including cavities for housing this optical device or devices therein.

Currently, support substrates made from ceramic are used, allowing easy production of cavities.

However, such support substrates are expensive and it is necessary to provide the passage for the "flex" connector intended to connect the optical device to a printed circuit card offset with respect to the package, which can make producing the package complex.

There is consequently a need to produce integrated-circuit packages, in particular optical packages, having less expensive carrier substrates that are simpler to produce while allowing an easy formation of cavities and an offset electrical connection.

SUMMARY

According to one embodiment, it is proposed to use, as carrier substrate for the package, an assembly including a flexible connector of the "flex" type sandwiched between two multilayer carrier substrates. In this way it is easy to produce cavities in this assembly, so as to house a component therein, for example an electronic integrated circuit chip, while allowing an offset electrical connection of the package by means of a projecting part of the flexible connector.

According to one aspect, an integrated-circuit package is proposed, comprising a flexible electrical-connection element sandwiched between a first face of a first multilayer support substrate, typically the bottom support substrate, and a second face of a second multilayer support substrate, typically the top support substrate.

The flexible connection element projects laterally with respect to the two multilayer support substrates and is in electrical contact with at least one of the two multilayer support substrates and optionally both multilayer support substrates.

The flexible connection element and the first multilayer support substrate include, in a first region of the package, respectively two first mutually facing orifices, defining together a first cavity at least partly closed off by a first part of the second face, typically the bottom face, of the second carrier substrate.

In some cases this first cavity may be completely closed off by the second face of the second carrier substrate.

A first component is located in said first cavity and is attached (directly or indirectly) to said first part of the second face of the second substrate and in electrical contact with the flexible connection element by means of the second multilayer support substrate.

According to one embodiment, the flexible connection element comprises at least one electrically conductive layer enrobed in an electrically insulating layer and each multilayer support substrate comprises at least one electrically conductive layer enrobed in an electrically insulating layer.

At least one of the two multilayer support substrates comprises locally, outside said first cavity, at least one electrically conductive pillar having a first end contacting said at least one electrically conductive layer of this multilayer support substrate and having a second end in local electrical coupling with said at least one electrically conductive layer of the flexible connection element.

In this embodiment, the two multilayer support substrates may not both be electrically connected to the flexible connector.

This being the case, in another possible embodiment, they may both be electrically connected to the flexible connector.

Thus, according to this other embodiment, the flexible connection element may comprise one or more electrically conductive layers, each enrobed in an electrically insulating layer.

Each multilayer support substrate comprises at least one electrically conductive layer enrobed in an electrically insulating layer, and each of the two multilayer support substrates comprises locally outside said first cavity at least one electrically conductive pillar having a first end contacting said at least one electrically conductive layer of the corresponding multilayer support substrate and having a second end in local electrical coupling with the electrically conductive layer or layers of the flexible connection element.

The package may comprise an electrically insulating filler layer, for example a layer known to a person skilled in the art by the English term "underfill", between each multilayer support substrate and the flexible element.

The first component may comprise an electronic chip.

In particular when the package is an optical package, the second multilayer support substrate advantageously comprises, in said first region, a first through orifice having a first end emerging in said first cavity facing the first component.

The first component may include a first optical device, for example an optical receiver, in optical coupling with the first end of the first through orifice.

The package may comprise a first optically transparent means, for example a window, optionally filtering, closing off a second end of the first through orifice.

The package may also include, in said first region, a first cap resting on the second multilayer support substrate and defining a first housing above said first cavity.

The first cap may include a first opening facing the first through orifice.

The package may include at least one first auxiliary optical element, for example at least one optical lens, in said first housing in optical coupling with said first opening and with the first optical device.

The package may have a more complex architecture, but always easy to implement using the same stack consisting of multilayer carrier substrate/flexible connector/multilayer carrier substrate.

Thus, according to one embodiment, the flexible connection element and the first multilayer support substrate include, in a second region of the package, respectively two mutually facing second orifices defining together a second cavity partially closed off by a second part of the second face of the multilayer support substrate.

The second multilayer support substrate may include, in said second region, a second through orifice merging in said second cavity.

A second component, for example another multilayer substrate, is located in said second cavity, attached (directly or indirectly) to said second part of the second face of the second multilayer support substrate.

This second component may optionally be in electrical contact with at least the second multilayer support substrate, and optionally also with the flexible connector by means of this second multilayer support substrate.

A second optical device, for example an optical emitting device, is located above the second component and at least partially in the second through orifice.

The second optical device may be in electrical contact through connecting wires ("wire bonding") with contact pads located on the first face, typically the top face, of the second multilayer support substrate.

The package may include, in said second region, a second cap resting on the second multilayer support substrate and defining a second housing above said second cavity.

The second cap may include a second opening facing the second through orifice.

The package may include at least one second auxiliary optical element, for example at least one lens, in said second housing in optical coupling with said second opening and with the second optical device.

According to an embodiment allowing better heat dissipation, the first multilayer support substrate includes a second face, typically the bottom face, opposite to the first face, each component attached to the second multilayer support substrate including a rear face opposite to the one attached to the second multilayer support substrate, and the package advantageously further includes a heat dissipator, for example a metal plate, in contact with the second face of the first multilayer support substrate and with the rear face of each component by means of a thermally conductive material, for example a thermal interface material (TIM).

The use of a sandwich consisting of multilayer carrier substrate/flexible connector/multilayer carrier substrate facilitates the implementation of a heat dissipator compared with packages of the ceramic type.

BRIEF DESCRIPTION OF THE DRAWINGS

Other advantages and features of the invention will emerge from the examination of the detailed description of embodiments and implementations, in no way limitative, and the accompanying drawings, on which.

DETAILED DESCRIPTION

Figure 1:
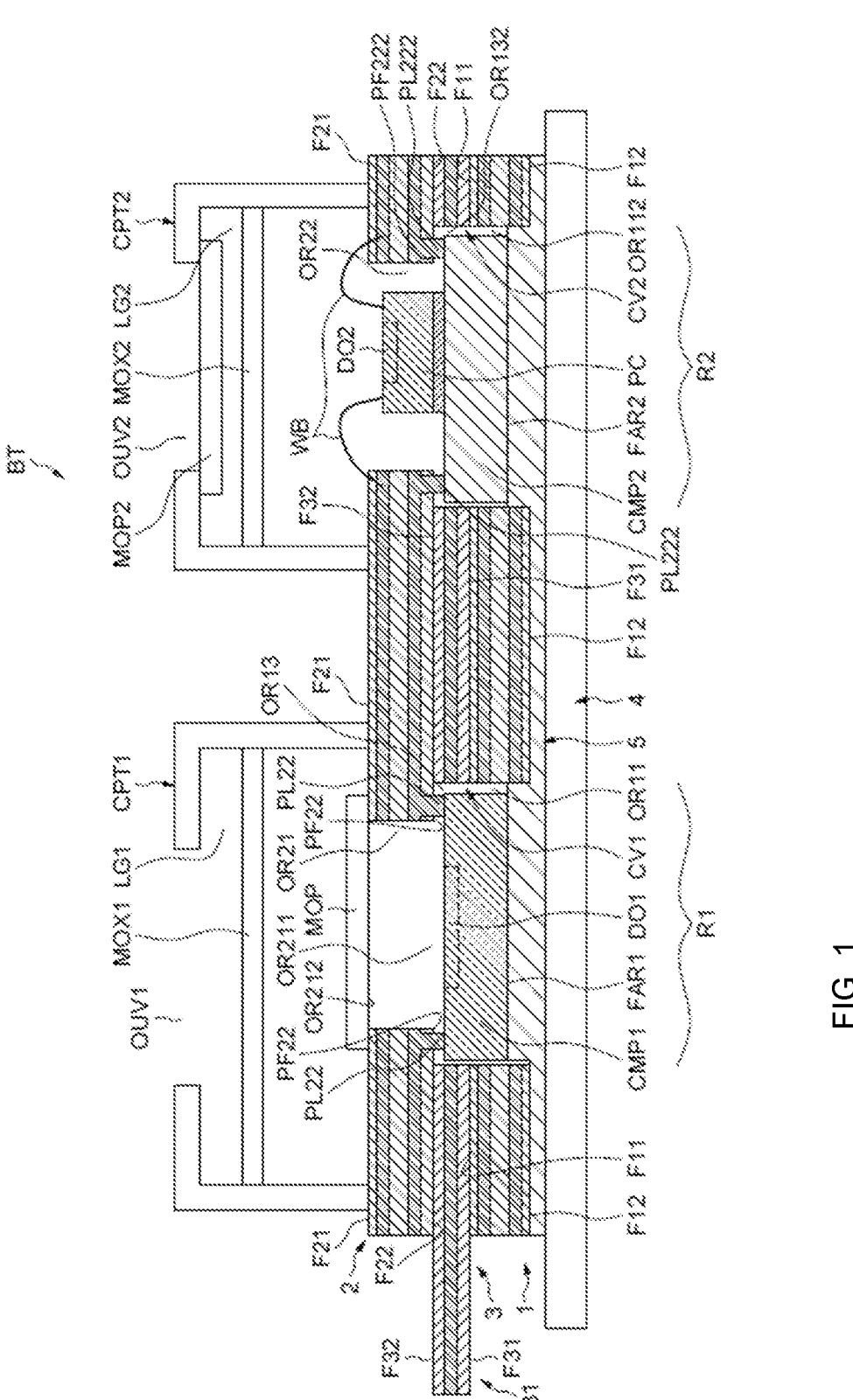
FIG. 1 shows a cross-section of a package.

On FIG. 1, the reference BT designates an integrated circuit package. This integrated circuit package comprises a flexible electrical connection element 3, also referred to as a flexible connector of the "flex" type, sandwiched between a first multilayer support substrate 1, here the bottom multilayer support substrate, and a second support substrate 2, here the top multilayer support substrate.

The flexible connector 3 includes one or more metallization levels or metallic layers, for example made from copper, mutually insulated by an insulating material, for example an insulating resin, typically having a thickness that may be between 10 and 30 microns.

Each multilayer support substrate conventionally includes one or more metallization levels, or metal layers, also typically made from copper, mutually insulated by a dielectric layer, typically having a thickness that may be between 30 microns and 200 microns.

The metal layers of the flexible connector 3 and of each multilayer support substrate 1, 2 generally include a plurality of metal tracks for conveying electrical signals.

More details will be given below, more particularly with reference to FIGS. 2A and 2B, with regard to the electrical connection between tracks of a multilayer support substrate and tracks of the flexible connector.

More particularly, as illustrated on FIG. 1, the flexible connector 3 is sandwiched between a first face F11, or top face, of the first support substrate 1 and a second face F22 or bottom face of the second support substrate 2.

And, more precisely, it is the first face F31, or bottom face, of the flexible connector 3 that is in contact with the top face F11 of the first support substrate and it is the top face F32 of the flexible connector that is in contact with the bottom face F22 of the second support substrate 2.

The flexible connection element 3 has a part 31 projecting laterally with respect to the two multilayer support substrates 1 and 2.

This projecting part 31 will allow an electrical connection between elements of the package and a printed card, for example, offset with respect to the package.

In a first region R1 of the package, the flexible connector 3 includes a first orifice OR13 and the first support substrate 1 also includes a first orifice OR11, the two orifices OR11 and OR13 being mutually facing each other (in vertical alignment) and defining together a first cavity CV1.

Here, the first cavity is partially closed off by a first part PF22 of the second face F22 of the second support substrate 2.

A first component CMP1, for example an electronic integrated circuit chip, is located in the first cavity CV1 and is attached to the first part PF22 of the second face F22 of the second support substrate 2 by means of a metal pillar, for example made from copper, PL22.

Moreover, the first component CMP1 is also in electrical contact with the flexible connector 3 by means of this pillar PL22 and a pillar between the second multilayer support substrate 2 and the flexible connector 3.

The second support substrate 2 also includes, in this embodiment, in the first region R1, a first through orifice OR21 having a first end OR211 emerging in the first cavity CV1 facing the first component CMP1.

In this embodiment, the first component CMP1 includes a first optical device DO1, for example a light-receiving device, in optical coupling with the first end OR211 of the first through orifice OR21.

A first optically transparent element MOP is also provided, for example a window, filtering or not, polarizing or not, closing off a second end OR212 of the first through orifice OR21.

The package BT also includes, in the first region R1, a first cap CPT1 resting on the first face or top face F21 of the second multilayer support substrate 2 and defining a first housing LG1 above the first cavity CV1.

In this embodiment, the first cap CPT1 includes a first opening OUV1 facing the first through orifice OR21.

Here at least one first auxiliary optical element MOX1 is also provided, for example a lens, located in the first housing LG1 in optical coupling with said first opening OUV1 and with the first optical device DO1.

In this embodiment, the flexible connector 3 of the optical package BT also includes, in a second region R2 of the package, a second orifice OR132.

The first support substrate 1 also includes, in the second region R2, a second orifice OR112.

The two second orifices OR112 and OR132 are mutually facing each other (in vertical alignment) and define together a second cavity CV2 that is here partially closed off by a second part PF222 of the second face F22 of the second support substrate 2.

Moreover, the second support substrate 2 includes, in the second region R2, a second through orifice OR22 emerging in the second cavity CV2.

A second component CMP2, for example another multilayer support substrate, is located in the second cavity CV2.

This second component is attached, by means of an electrically conductive pillar PL222, to the second part PF222 of the second face F22 of the second support substrate 2 and is here furthermore in electrical contact with the flexible connector 3 by means of this pillar PL222 and a pillar between the second support substrate 2 and the flexible connector 3.

The package BT also includes here another electronic integrated circuit chip PC including a second optical device DO2, for example a light-emitting device, which is located above the second component CMP2 and partially in the second through orifice OR22.

This second optical device DO2 is here in electrical contact through connecting wires WB with contact pads located on the first face F21 of the second multilayer support substrate 2.

The optical package BT also includes, in the second region R2, a second cap CPT2 resting on the first face F21 of the second multilayer support substrate 2 and defining a second housing LG2 above the second cavity CV2.

The second cap CPT2 here includes a second opening OUV2 facing the second through orifice OR22.

And the package here includes a second auxiliary optical element MOX2, for example a lens, located in the second housing LG2 in optical coupling with the second opening OUV2 and with the second optical device DO2.

The second opening OUV2 may be closed off by a second closure element MOP2, for example a window.

The optical package BT also includes, in this embodiment, a heat dissipator 4, attached to the second face F12, or rear face, of the first support substrate 1 and to the rear face FAR1 of the first component CMP1 and to the rear face FAR2 of the second component CMP2, by means of a thermally conductive material 5, for example a thermal interface material.

Figure 2A:
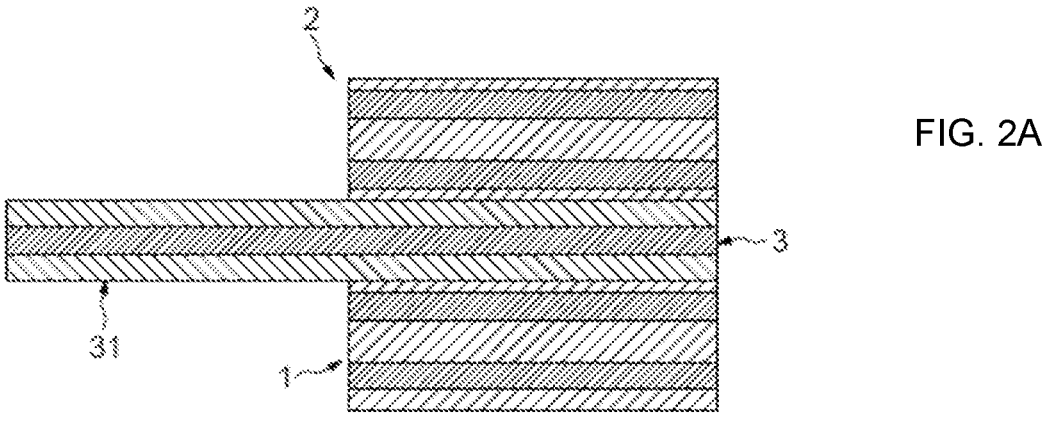
FIGS. 2A and 2B illustrate details of the electrical connection between tracks of a multilayer support substrate and tracks of a flexible connector.
Figure 2B:
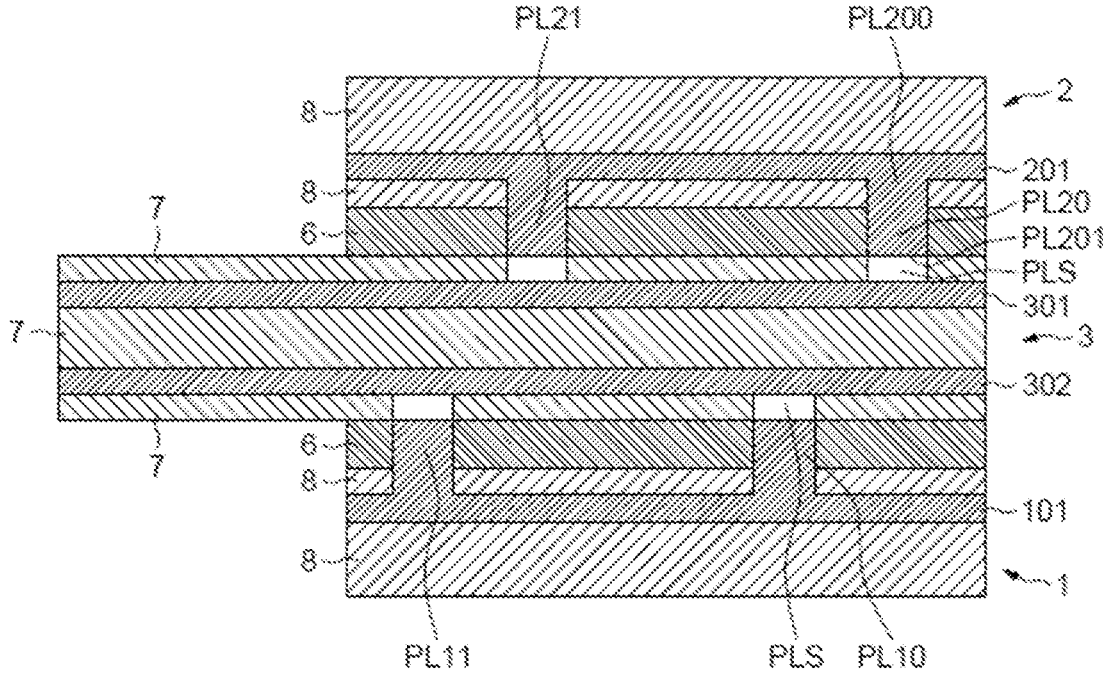

Reference is now made more particularly to FIG. 2A and to FIG. 2B to describe an example of mechanical and electrical cooperation between the multilayer support substrates and the flexible connector 3.

FIG. 2A schematically repeats a part of the sandwich of FIG. 1, situated outside and to the left of the first cavity, and FIG. 2B illustrates in more detail this mechanical and electrical cooperation.

In the example illustrated on FIG. 2B, a single metallization level, or metal layer 101, of the first multilayer substrate 1 has been shown and a single metallization level, or metal layer, 201 of the second multilayer substrate 2 has been shown.

Moreover, the flexible connector 3 here includes two metallization levels, or metal layers 301 and 302.

Each of the metallization levels 201, 301, 302, 101 includes one or more metal tracks.

The metallization levels 301 and 302 of the flexible connector are mutually insulated by the insulating resin 7 while the metallization levels 201 and 101 of the two carrier substrates 1 and 2 are electrically insulated by the dielectric material 8.

In the example in FIG. 2A and in FIG. 2B, each of the two multilayer carrier substrates 1 and 2 comprises locally, outside the first cavity CV1, one or more electrically conductive pillars, for example made from copper, here referenced PL20, PL21, PL10 and PL11.

Each electrically conductive pillar has a first end, for example PL200 for the pillar PL20, contacting the electrically conductive layer 201, and a second end, for example PL201 for the pillar PL20, in local electrical coupling with the electrically conductive layers of the flexible connector 3.

More particularly, in this regard, conventional soldering studs PLS are located at the second ends of the pillars and make it possible to provide the attachment and the electrical contact of these pillars with the electrically conductive layer of the corresponding flexible element 3.

Reference is now made more particularly to FIGS. 3 to 6, which schematically illustrate views of the various faces of the support substrates 1 and 2 and of the flexible connector 3.

Figures 3, 4, 5, 6:
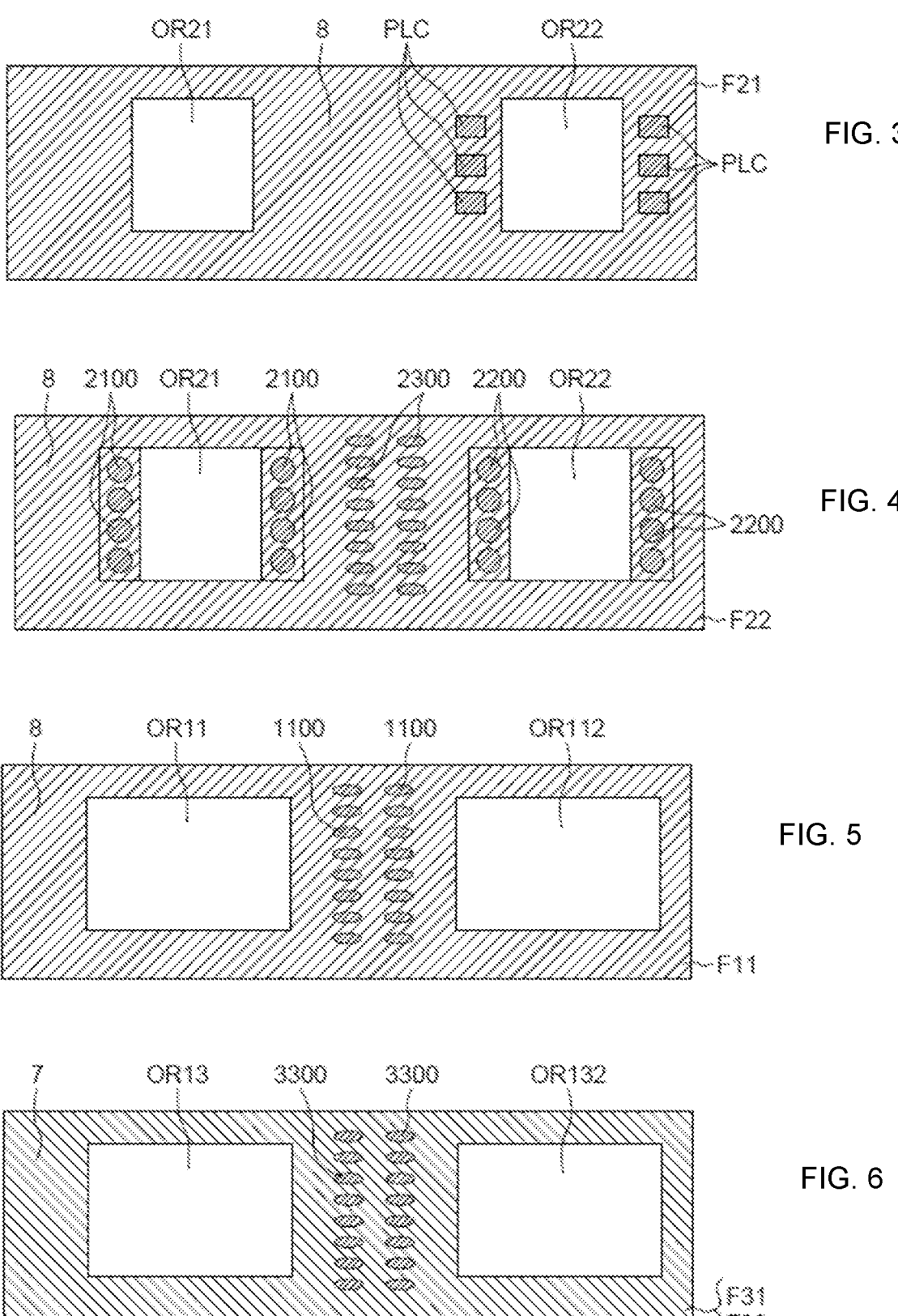
FIGS. 3 to 6 schematically illustrate views of various faces of support substrates and the flexible connector.

More particularly, FIG. 3 illustrates a plan view of the first face or top face F21 of the second support substrate 2 (i.e., the top support substrate).

The top insulating layer 8 includes, on either side of the orifice OR22, openings so as to leave clear the contact pads PLC that will enable the connecting wires WB to be soldered.

FIG. 4 illustrates a view from below of the second face or bottom face F22 of the second support substrate 2.

The bottom insulating layer 8 includes, on either side of the orifice OR22, openings 2200 so as to leave clear the underlying metal layer to allow production of the corresponding pillars that will make it possible to electrically contact the second component CMP2.

Likewise, on either side of the orifice OR21, openings 2100 are provided so as to locally leave clear the underlying metal layer to allow production of the pillars PL22 that will make it possible to electrically contact the first component CMP1.

Moreover, between the two orifices OR21 and OR22, openings 2300 are provided so as to locally leave clear the underlying metal layer to allow production of the pillars, such as the pillars PL20 of FIG. 2B, that will make it possible to electrically contact the flexible connector 3.

FIG. 5 is a plan view of the first face or top face F11 of the first support substrate 1 (i.e., the bottom support substrate).

It can be seen that the top insulating layer 8 includes openings 1100 corresponding to the openings 2300 of the face F22 so as to accommodate the other ends of the pillars PL20.

FIG. 6 illustrates the first face F31 or the second face F32 of the flexible connector 3, on which it can be seen that the layer of resin of these faces F31 or F32 includes openings 3300 corresponding to the openings 1100 and to the openings 2300 so as to accommodate the other ends of the pillars PL20.

Reference is now made more particularly to FIGS. 7 to 10 to describe an embodiment of a method for manufacturing a stack consisting of multilayer support substrate/flexible connector/multilayer support substrate.

The support substrates are first of all prepared so as to adopt, for example, the configurations illustrated on FIGS. 3 to 5, and the flexible connector is prepared so as to have for example a configuration of the type illustrated on FIG. 6.

Figures 7, 8, 9, 10:
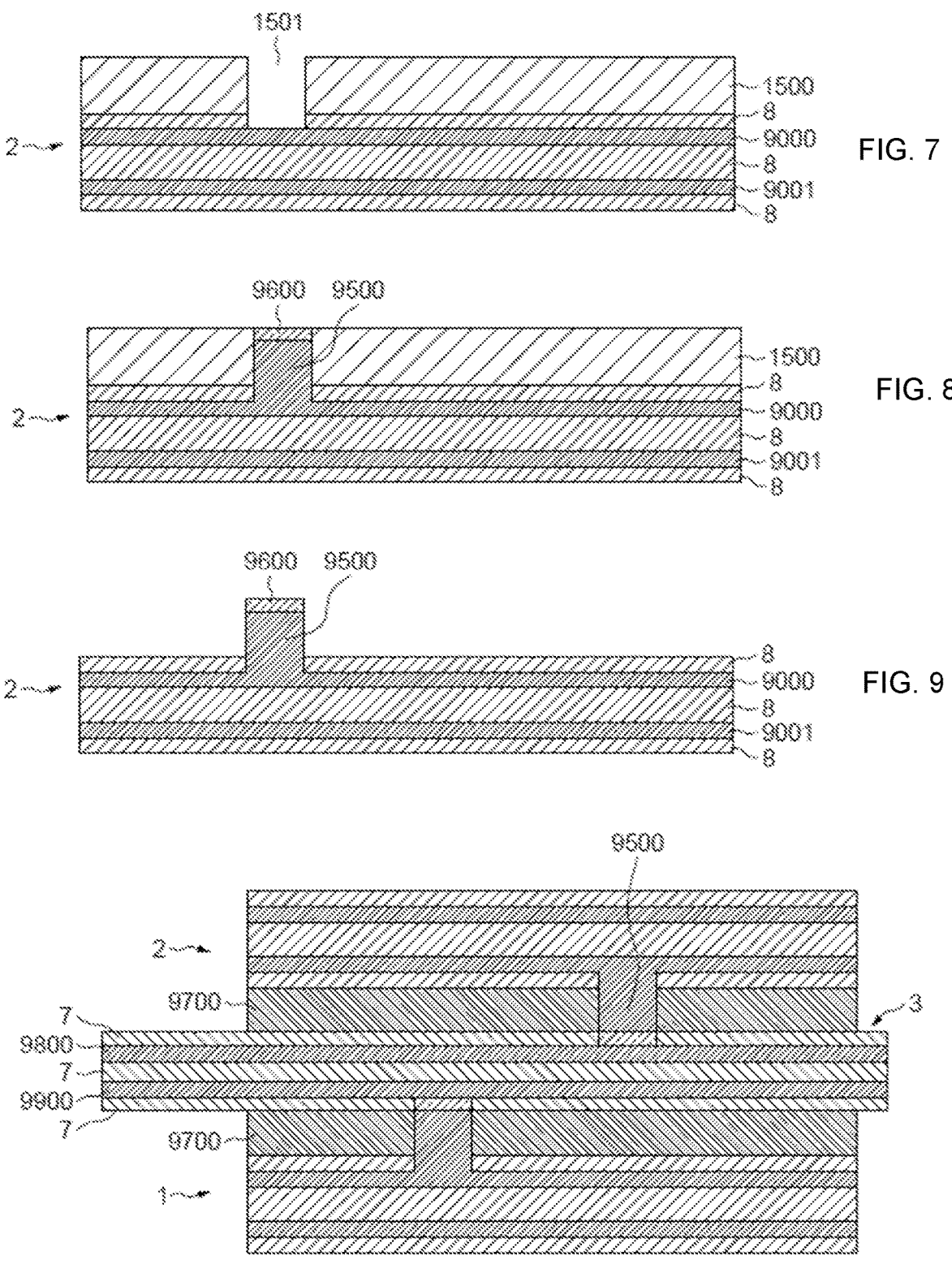
FIGS. 7 to 10 illustrate steps of a method for manufacturing a stack consisting of multilayer support substrate/flexible connector/multilayer support substrate.

Then, as illustrated on FIG. 7, with regard for example to the multilayer support substrate 2, a layer of resin 1500 is deposited on the insulating layer 8 and then, by conventional photolithography, insolation and resin development steps, an orifice 1501 is produced in the resin 1500 at the location of a future metal pillar. This orifice 1501 emerges on one of the metal tracks of the metal layer 9000 of the support substrate 2.

Then, for example by an electrolytic deposition of copper, the pillar 9500 is grown on the metal track 9000 (FIG. 8) and a soldering block 9600 is formed at its end.

Then, as illustrated on FIG. 9, the resin 1500 is removed.

Then, as illustrated on FIG. 10, a layer of filler material 9700 is deposited on the flexible connector 3 and next the support substrate 2 provided with the pillar 9500 and the soldering stud 9600 is applied by thermocompression to the flexible connector, the pillar 9500 then being soldered on the required location of the metal track 9800, during the thermocompression operation.

By way of indication, the temperature used for this thermocompression operation is of the order of 150° C. to 180° C. and the pressure is of the order of 3 MPa to 4 MPa.

By means of this thermocompression operation, the filler material is removed at the point where the pillar 9500 must come into contact with the metal track 9800.

In a variant, it would be possible to first of all implement the operation of transferring the multilayer support substrate to the flexible connector and then to remove the filler material 9700 by capillarity.

Once the support substrate 2 has been secured to the flexible connector 3, the same operations are implemented for the support substrate 1, which is next secured by thermocompression to the other face of the flexible connector 3.

The invention claimed is:
1. An integrated-circuit package, comprising:
a first multilayer support substrate;
a second multilayer support substrate;

a flexible electrical-connection element sandwiched between a first face of the first multilayer support substrate and a second face of the second multilayer support substrate;
the flexible electrical-connection element including a portion laterally projecting with respect to the first and second multilayer support substrates;
the flexible electrical-connection element in electrical contact with at least one of the first and second multilayer support substrates;
the flexible electrical-connection element and the first multilayer support substrate including, in a first region, respectively two first mutually facing orifices defining together a first cavity at least partially closed off by a first part of the second face of the second multilayer support substrate; and
a first component located in said first cavity, attached on said first part of the second face of the second multilayer substrate and in electrical contact with the flexible electrical-connection element by way of the second multilayer support substrate.

2. The package according to claim 1, wherein the flexible electrical-connection element comprises at least one electrically conductive layer within an electrically insulating layer, wherein each multilayer support substrate comprises at least one electrically conductive layer within an electrically insulating layer, and wherein at least one of the first and second multilayer support substrates locally comprises, outside said first cavity, at least one electrically conductive pillar having a first end contacting said at least one electrically conductive layer of said at least one of the first and second multilayer support substrates and having a second end in local electrical coupling with said at least one electrically conductive layer of the flexible electrical-connection element.

3. The package according to claim 1, wherein the flexible electrical-connection element comprises one or more electrically conductive layers within an electrically insulating layer, wherein each multilayer support substrate comprises at least one electrically conductive layer within an electrically insulating layer, and wherein each of the first and second multilayer support substrates locally comprises, outside said first cavity, at least one electrically conductive pillar having a first end contacting said at least one electrically conductive layer of the corresponding first and second multilayer support substrate and having a second end in local electrical coupling with the electrically conductive layer or layers of the flexible electrical-connection element.

4. The package according to claim 1, further comprising an electrically insulating filler layer between each of the first and second multilayer support substrates and the flexible electrical-connection element.

5. The package according to claim 1, wherein the first component comprises an electronic integrated circuit chip.

6. The package according to claim 1, wherein the second multilayer support substrate includes, in said first region, a first through orifice having a first end emerging in said first cavity facing the first component.

7. The package according to claim 6, wherein the first component includes a first optical device in optical coupling with the first end of the first through orifice.

8. The package according to claim 7, comprising a first optically transparent element closing off a second end of the first through orifice.

9. The package according to claim 1, further including, at said first region, a first cap resting on the second multilayer support substrate and defining a first housing above said first cavity.

10. The package according to claim 9, wherein the second multilayer support substrate includes, in said first region, a first through orifice having a first end emerging in said first cavity facing the first component, and wherein the first cap has a first opening facing the first through orifice.

11. The package according to claim 10, wherein the first component includes a first optical device in optical coupling with the first end of the first through orifice, and further including at least one first auxiliary optical element in said first housing in optical coupling with said first opening and with the first optical device.

12. The package according to claim 1, wherein the flexible electrical-connection element and the first multilayer support substrate include, in a second region of the package, respectively two second mutually facing orifices defining together a second cavity partially closed off by a second part of the second face of the second substrate, and the second multilayer support substrate includes, in said second region, a second through orifice emerging in said second cavity, the package further including:

a second component located in said second cavity, attached to said second part of the second face of the second multilayer support substrate; and a second optical device located above the second component and at least partially in the second through orifice.

13. The package according to claim 12, wherein the second optical device is in electrical contact through connecting wires with contact pads located on the first face of the second multilayer support substrate.

14. The package according to claim 12, further including, at said second region, a second cap resting on the second multilayer support substrate and defining a second housing above said second cavity, the second cap including a second opening facing the second through orifice, the package further including at least one second auxiliary optical element in said second housing in optical coupling with said second opening and with the second optical device.

15. The package according to claim 1, wherein the first multilayer support substrate includes a second face opposite to the first face, wherein each component attached to the first multilayer support substrate includes a rear face opposite to the one attached to the second multilayer support substrate, and the package further including a heat dissipator in contact with the second face of the first multilayer support substrate and with the rear face of each component using a thermally conductive material.

16. The package according to claim 1, wherein the portion of the flexible electrical-connection element laterally projecting with respect to the first and second multilayer support substrates is configured for making an electrical connection between elements of the package and a printed card that is offset with respect to the package.

17. An integrated-circuit package, comprising:
a first multilayer support substrate;
a second multilayer support substrate;
a flexible electrical-connection element sandwiched between a first face of the first multilayer support substrate and a second face of the second multilayer support substrate;
wherein the flexible electrical-connection element includes a first orifice;
wherein the first multilayer support includes a second orifice;
wherein the first and second orifices face each other and together define a cavity;
a component located in said cavity;
wherein a first part of the second multilayer support substrate extends at least partially over the cavity and includes a first metal pillar at the second face of the second multilayer support substrate that is electrically connected to the component;
wherein a second part of the second multilayer support substrate includes a second metal pillar at the second face of the second multilayer support substrate that is electrically connected to the flexible electrical-connection element; and
wherein the second multilayer support substrate further includes an electrically conductive layer electrically connecting between the first and second metal pillars.

18. The package according to claim 17, wherein the component comprises an electronic integrated circuit chip.

19. The package according to claim 18, wherein the second multilayer support substrate includes, in said first region, a through orifice having a first end emerging in said cavity facing the electronic integrated circuit chip.

20. The package according to claim 19, wherein the electronic integrated circuit chip includes a first optical device in optical coupling with the first end of the through orifice.

21. The package according to claim 20, comprising an optically transparent element closing off a second end of the through orifice.

22. The package according to claim 17, further including a heat dissipator mounted to a second face of the first multilayer support substrate and including a portion extending into the cavity to make a thermal connection to a rear face of the component using a thermally conductive material.

23. The package according to claim 17, wherein a portion of the flexible electrical-connection element laterally projects with respect to the first and second multilayer support substrates and is configured to make an electrical connection between elements of the package and a printed card that is offset with respect to the package.

* * * * *